(12) United States Patent
Ito et al.

(10) Patent No.: US 9,879,156 B2
(45) Date of Patent: Jan. 30, 2018

(54) POLISHING COMPOSITION

(71) Applicant: FUJIMI INCORPORATED, Kiyosu-shi, Aichi (JP)

(72) Inventors: Jun Ito, Kiyosu (JP); Kazutoshi Hotta, Kiyosu (JP); Hiroyasu Sugiyama, Kiyosu (JP); Hitoshi Morinaga, Kiyosu (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 0 days.

(21) Appl. No.: 14/768,998

(22) PCT Filed: Feb. 7, 2014

(86) PCT No.: PCT/JP2014/052956
§ 371 (c)(1),
(2) Date: Aug. 19, 2015

(87) PCT Pub. No.: WO2014/129328
PCT Pub. Date: Aug. 28, 2014

(65) Prior Publication Data
US 2016/0002500 A1 Jan. 7, 2016

(30) Foreign Application Priority Data

Feb. 20, 2013 (JP) ................. 2013-031228
Aug. 28, 2013 (JP) ................. 2013-177027

(51) Int. Cl.
| | | |
|---|---|---|
| *H01L 21/302* | (2006.01) | |
| *H01L 21/461* | (2006.01) | |
| *B44C 1/22* | (2006.01) | |
| *C23F 1/00* | (2006.01) | |
| *C03C 15/00* | (2006.01) | |
| *C03C 25/68* | (2006.01) | |
| *C25F 3/00* | (2006.01) | |
| *C09G 1/02* | (2006.01) | |
| *C09G 1/00* | (2006.01) | |
| *H01L 21/306* | (2006.01) | |
| *H01L 21/304* | (2006.01) | |
| *H01L 21/321* | (2006.01) | |
| *C09K 3/14* | (2006.01) | |
| *B24B 37/00* | (2012.01) | |
| *C30B 29/20* | (2006.01) | |
| *C30B 33/00* | (2006.01) | |
| *B24B 37/04* | (2012.01) | |

(52) U.S. Cl.
CPC ............. *C09G 1/02* (2013.01); *B24B 37/00* (2013.01); *B24B 37/044* (2013.01); *C09G 1/00* (2013.01); *C09K 3/1409* (2013.01); *C09K 3/1454* (2013.01); *C09K 3/1463* (2013.01); *C30B 29/20* (2013.01); *C30B 33/00* (2013.01); *H01L 21/304* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,398,827 B1 * | 6/2002 | Ota ..................... | C09G 1/02 106/3 |
| 2004/0132306 A1 * | 7/2004 | Bellman .............. | C09G 1/02 438/690 |
| 2006/0196849 A1 * | 9/2006 | Moeggenborg ..... | B24B 37/0056 216/88 |
| 2009/0104851 A1 | 4/2009 | Cherian et al. | |
| 2012/0094491 A1 | 4/2012 | Kanamaru et al. | |
| 2014/0363973 A1 | 12/2014 | Kanamaru et al. | |

FOREIGN PATENT DOCUMENTS

| | | |
|---|---|---|
| JP | 2001-011433 A | 1/2001 |
| JP | 2008-044078 A | 2/2008 |
| JP | 2008-531319 A | 8/2008 |
| JP | 2010-540265 A | 12/2010 |
| TW | 201113358 A1 | 4/2011 |
| WO | WO 2011/021599 A1 | 2/2011 |

OTHER PUBLICATIONS

Japanese Office Action dated Nov. 8, 2016 as issued in corresponding Japanese Application No. 2013-177027 and its English translation thereof.

Japanese Office Action dated May 10, 2016 as issued in corresponding Japanese Application No. 2013-177027 and its English translation thereof.

Chinese Office Action dated Nov. 21, 2016 as issued in corresponding Chinese Application No. 201480009493.3 and its English translation thereof.

Chinese Office Action dated Aug. 9, 2017 as issued in corresponding Chinese Application No. 201480009493.3 and its English translation thereof.

\* cited by examiner

*Primary Examiner* — Stephanie Duclair
(74) *Attorney, Agent, or Firm* — Foley & Lardner LLP

(57) ABSTRACT

Provided is a polishing composition which can polish a sapphire substrate having a non-polar plane or a semi-polar plane at a high polishing rate.

The invention is a polishing composition used in an application to polish a sapphire substrate having a non-polar plane or a semi-polar plane, the polishing composition containing colloidal silica particles and water, in which a value obtained by dividing a specific surface area (unit: $m^2/g$) of the colloidal silica particles by a number average particle diameter (unit: nm) of the colloidal silica particles, that is, (specific surface area/number average particle diameter) is 0.5 or more and 3.0 or less.

8 Claims, No Drawings

POLISHING COMPOSITION

TECHNICAL FIELD

The present invention relates to a polishing composition, and more specifically, to a polishing composition used in an application to polish a sapphire substrate having a non-polar plane or a semi-polar plane.

BACKGROUND ART

As a method of processing sapphire used as a substrate material when LEDs or electronic devices are manufactured, the following method is generally used. An exposing process of a crystal plane of grown sapphire crystal, an outer circumference grinding process, an orientation flat grinding process, and a cutting process are performed and then a cut piece is ground to a predetermined thickness obtained by adding a polishing allowance to a target final thickness of a substrate by using a surface grinding apparatus. After that, a polishing process is performed on the surface-ground sapphire substrate. The sapphire substrate has different properties depending on plane orientation thereof, and it is possible to select a substrate having more suitable plane orientation according to an application thereof. For example, it is known that a polar plane such as a C-plane or a semi-polar plane such as an R-plane is suitable for an application as a crystal growth substrate material such as materials of LEDs or electronic devices, and a non-polar plane such as an A-plane or an M-plane is suitable for an application as a substrate for thin film or wind protection of a timepiece in which a flawless substrate with a high hardness is required. However, sapphire has a very stable chemical property, that is, the sapphire is extremely difficult to be affected by acid or alkali, and has the second-highest hardness behind diamond. For this reason, in a polishing process, a sapphire substrate is finished with a desired surface roughness or flatness by using a high hardness material such as diamond as an abrasive grain. However, since damage caused by processing exists on the surface of the sapphire substrate which has been processed by the cutting or grinding process described above and there is a need for removing a surface layer having such damage in order to obtain a smooth surface, significant processing time is required for polishing of the sapphire substrate. From such a point of view, regarding a polishing composition to be used in an application to polish a sapphire substrate, it is important to achieve a decrease in abrasive grain cost and a high polishing rate.

JP 2008-531319 W (US 2006/196849 A) discloses a method of polishing a surface (for example, a C-plane or a R-plane) of a sapphire substrate with a polishing slurry that contains a predetermined amount of an inorganic abrasive material such as colloidal silica dissolved in an aqueous medium containing a sufficient amount of a salt compound dissolved therein as an additive and has a basic pH. According to this, a rate of sapphire removal is increased by about 45% as compared with a polishing slurry that does not contain the salt compound.

Further, JP 2008-44078 A discloses a polishing composition containing a relatively high concentration of colloidal silica which is used to make a surface of a sapphire substrate smoother, and a polishing method using the same.

SUMMARY OF INVENTION

However, when the polishing compositions described in JP 2008-531319 W (US 2006/196849 A) and JP 2008-44078 A described above are used in polishing sapphire substrates, particularly, sapphire substrates having a non-polar plane (for example, an A-plane or an M-plane) or a semi-polar plane (for example, an R-plane), as compared with a sapphire substrate having a polar plane (for example, a C-plane), these sapphire substrates have a relatively high hardness and polishing processing is difficult to be performed on such sapphire substrates. Accordingly, a problem arises in that a sufficiently high polishing rate cannot be achieved.

The invention was made based on the findings described above, and an object thereof is to provide a polishing composition which can polish a sapphire substrate having a non-polar plane or a semi-polar plane at a high polishing rate.

The present inventors conducted extensive studies in order to solve the aforementioned problems. As a result, they found that the aforementioned problems could be solved by a polishing composition containing colloidal silica particles in which a value obtained by dividing a specific surface area (unit: $m^2/g$) of the colloidal silica particles by a number average particle diameter (unit: nm) thereof, that is, (specific surface area/number average particle diameter) is 0.5 or more and 3.0 or less. Therefore, the invention has been completed based on the finding described above.

That is, the present invention is a polishing composition used in an application to polish a sapphire substrate having a non-polar plane or a semi-polar plane, and the polishing composition contains: colloidal silica particles and water, wherein a value obtained by dividing a specific surface area (unit: $m^2/g$) of the colloidal silica particles by a number average particle diameter (unit: nm) of the colloidal silica particles, that is, (specific surface area/number average particle diameter) is 0.5 or more and 3.0 or less.

DESCRIPTION OF EMBODIMENTS

The present invention is a polishing composition used in an application to polish a sapphire substrate having a non-polar plane or a semi-polar plane, and the polishing composition contains: colloidal silica particles and water, wherein a value obtained by dividing a specific surface area (unit: $m^2/g$) of the colloidal silica particles by a number average particle diameter (unit: nm) of the colloidal silica particles, that is, (specific surface area/number average particle diameter) is 0.5 or more and 3.0 or less. The polishing composition of the invention having such a configuration can polish a sapphire substrate having a non-polar plane or a semi-polar plane at a high polishing rate.

The present inventors conducted intensive studies on colloidal silica particles which exhibits a high polishing rate with respect to a sapphire substrate having a non-polar plane or a semi-polar plane, and as a result, they found that a polishing rate could be improved by adjusting a value obtained by dividing a specific surface area of the colloidal silica particles by a number average particle diameter thereof. The mechanism thereof has not sufficiently elucidated yet, but can be estimated as follows. It is known that the polishing of the sapphire substrate is performed by solid phase reaction between abrasive grains and the sapphire substrate. For example, as comparing a polishing rate in the case of polishing an A-plane that is a non-polar plane with a polishing rate in the case of polishing a C-plane that is a polar plane when the polishing is performed by using the same polishing composition, the polishing rate in the case of the A-plane is lower than that in the case of the C-plane, and thus it could be said that the A-plane is less polished as compared with the C-plane. This is because the A-plane has a characteristic of easily repelling water as compared with the C-plane when the polished A-plane are washed and then observed. For this reason, it is considered that the A-plane becomes hydrophobic during polishing. When a wetting agent such as a water-soluble polymer is added to the polishing composition in order to solve the aforementioned problem, and wettability to a substrate surface is intended to be improved, aggregation of abrasive grains occurs or sliding of abrasive grains with respect to the sapphire substrate occurs. Accordingly, polishing efficiency tends to be deteriorated.

Therefore, in order to polish the non-polar plane or the semi-polar plane of the sapphire substrate at a high polishing rate, it is necessary to optimize the asperity shape of surfaces of the colloidal silica particles serving as abrasive grains or the particle size distribution of the colloidal silica particles to be supplied between the polishing pad and the sapphire substrate. The abrasive grains during polishing are pressed against the substrate by processing pressure of a polishing machine and then the abrasive grains are solid-phase reacted with the substrate surface. A portion softened by the solid phase reaction is removed by friction force of the abrasive grains. In a case where lots of asperities are present on the surfaces of the abrasive grains, the solid phase reaction between the abrasive grains and the sapphire substrate is considered to be more efficiently performed. Further, in a case where the aspect ratio of the abrasive grains is large, the friction force of the abrasive grains increases and thus products generated by the solid phase reaction can be more efficiently removed. When lots of asperities are present on the surfaces of the abrasive grains even in the case of equal number average particle diameter of the abrasive grains, the specific surface area thereof is considered to increase. Accordingly, abrasive grains having a lager value of the specific surface area of the abrasive grains with respect to the number average particle diameter thereof are considered to be more suitable for polishing of the sapphire substrate. However, the specific surface area is also increased by an increase in fine particles, but in a case where the fine particles are excessively contained, processing pressure to the abrasive grains is scattered and thus the solid phase reaction becomes poor. Therefore, polishing efficiency is considered to be deteriorated. Accordingly, it can be estimated that there is a proper range of a value of the specific surface area of the abrasive grains with respect to the number average particle diameter thereof. Further, this tendency is different from the case of a C-plane that is a polar plane, and it can be said that the relevant tendency is clearly distinguished from the related art.

Hereinafter, the configuration of the polishing composition of the invention will be described in detail.

[Polishing Object]

A polishing object according to the invention is a sapphire substrate having a non-polar plane such as an A-plane or an M-plane or a semi-polar plane such as an R-plane. Among these, a sapphire substrate having a non-polar plane is preferable, and a sapphire substrate having an A-plane is more preferable.

[Colloidal Silica Particles]

Colloidal silica particles according to the invention are used as abrasive grains, and a value obtained by dividing a specific surface area (unit: $m^2/g$) of the colloidal silica particles by a number average particle diameter (unit: nm) of the colloidal silica particles, that is, (specific surface area/ number average molecular weight) is 0.5 or more and 3.0 or less.

Types of colloidal silica particles are not particularly limited, but any types obtained by various known producing methods can be used. Further, commercialized products may be used as the colloidal silica particles. Examples of the commercialized products include colloidal silica produced by Nissan Chemical Industries, Ltd., JGC Catalysts and Chemicals Ltd., NIPPON CHEMICAL INDUSTRIAL CO., LTD., FUSO CHEMICAL CO., LTD., ADEKA CORPORATION, Akzo Nobel Co., Ltd., AZ Electronic Materials, Nalco Chemical Company, or W. R. Grace & Co.-Conn. Further, when two or more types of colloidal silica particles produced by different processes or manufacturers as described above are prepared and then they are mixed with each other at an arbitrary ratio, preferred colloidal silica particles can be obtained.

The specific surface area of the colloidal silica particles is affected by a surface shape or quantity of pores in addition to a diameter or a shape of a primary particle, and in particular, when fine particulate elements are contained in a large amount or there are lots of asperities or pores on surfaces of particles, the value of the specific surface area is increased. A lower limit of the specific surface area of the colloidal silica particles according to the invention is preferably 40 $m^2/g$ or more, and more preferably 45 $m^2/g$ or more. Further, an upper limit of the specific surface area of the colloidal silica particles is preferably 90 $m^2/g$ or less, more preferably 85 $m^2/g$ or less, still more preferably 65 $m^2/g$ or less, and particularly preferably 60 $m^2/g$ or less. When the value of the specific surface area is within the above ranges, a higher polishing rate is easily achieved. Incidentally, the value of the specific surface area of the colloidal silica particles can be obtained by a nitrogen adsorption method (a BET method).

The number average particle diameter of the colloidal silica particles is affected particularly by sizes of particles. A lower limit of the number average particle diameter of the colloidal silica particles is preferably 25 nm or more, more preferably 30 nm or more, still more preferably 35 nm or more, and particularly preferably 50 nm or more. Further, an upper limit of the number average particle diameter of the colloidal silica particles is preferably 70 nm or less and more preferably 65 nm or less. When the value of the number average particle diameter is within the above ranges, a high polishing rate is easily achieved. Incidentally, the number average particle diameter of the colloidal silica particles is calculated, for example, from an image observed by a scanning electron microscope according to image analysis using general image analysis software.

In the invention, the value obtained by dividing the specific surface area (unit: $m^2/g$) of the colloidal silica particles by the number average particle diameter (unit: nm) of the colloidal silica particles, that is, (specific surface area/number average particle diameter) is 0.5 or more and 3.0 or less. When the divided value, that is, (specific surface area/number average particle diameter) is less than 0.5, there is a concern that a sufficient polishing rate cannot be achieved or polishing is unstable due to an increase in polishing resistance. On the other hand, when the value is more than 3.0, a sufficient polishing rate is not achieved, and this is because contact between abrasive grains and a substrate is not sufficient. The value obtained by dividing the specific surface area (unit: $m^2/g$) of the colloidal silica particles by the number average particle diameter (unit: nm) thereof, that is, (specific surface area/number average particle diameter) is preferably 0.7 or more. Further, the value obtained by dividing the specific surface area (unit: $m^2/g$) of the colloidal silica particles by the number average particle diameter (unit: nm) thereof, that is, (specific surface area/number average particle diameter) is preferably 2.0 or less, more preferably 1.8 or less, and still more preferably 1.5 or less.

When a particle size at a 3% accumulation point from smaller particle size is denoted as $D_3$ and a particle size at a 97% accumulation point from smaller particle size is denoted as $D_{97}$ in a cumulative number distribution of the colloidal silica particles, a value obtained by dividing $D_{97}$ by $D_3$, that is, ($D_{97}/D_3$) is preferably 2.0 or more, more preferably 2.5 or more, and still more preferably 3.0 or more.

The $D_{97}/D_3$ described above indicates a width of the particle size distribution of colloidal silica particles. When the value thereof is 2.0 or more, polishing by the solid phase reaction between the colloidal silica particles and the sapphire substrate is more favorably performed.

Further, the $D_{97}/D_3$ described above is preferably 10 or less, and more preferably 7 or less.

The $D_3$ and $D_{97}$ described above are calculated, for example, from an image observed by a scanning electron microscope according to image analysis using general image analysis software.

The aspect ratio of the colloidal silica particles according to the invention is preferably 1.10 or more, and more preferably 1.12 or more. Further, the aspect ratio of the colloidal silica particles is preferably 1.25 or less, and more preferably 1.20 or less. When the aspect ratio of the colloidal silica particles is within the above ranges, friction of the colloidal silica particles to the sapphire substrate is further increased and thus the solid phase reaction between the colloidal silica particles and the sapphire substrate is favorably performed.

The aspect ratio of the colloidal silica particles can be obtained, for example, by image analysis using an electron microscope. Specifically, the predetermined number (for example, total 1000 particles (=100 particles per one visual field×10 fields) of particles are observed by using a scanning electron microscope and a minimum rectangle that circumscribes each particle image is drawn. Then, the aspect ratio of the colloidal silica particles can be obtained by calculating values obtained by dividing the length of the long side (long diameter value) by the length of the short side (short diameter value) of the rectangle drawn with respect to each particle image and calculating an average value thereof. Incidentally, the calculation of the aspect ratio based on the image analysis process in this way can be performed by using general image analysis software.

A lower limit of a content of the colloidal silica particles in the polishing composition of the invention is preferably 1% by mass or more, and more preferably 2% by mass or more. When the lower limit of a content of the colloidal silica particles is within the above ranges, a high polishing rate is easily achieved.

Further, an upper limit of a content of the colloidal silica particles in the polishing composition of the invention is preferably 40% by mass or less, and more preferably 30% by mass or less. When the upper limit of a content of the colloidal silica particles is within the above ranges, it is easy to obtain a surface with less scratch by polishing using the polishing composition while a manufacturing cost of the polishing composition is decreased.

The polishing composition of the invention may contain abrasive grains other than the colloidal silica particles described above. Examples of the other abrasive grains include silica, such as fumed silica, other than the colloidal silica particles, alumina, zirconia, ceria, and titania. Here, a proportion of the other abrasive grains in the polishing composition is preferably low, and it is more preferable not to substantially contain abrasive grains other than colloidal silica particles.

[Water]

The polishing composition of the invention contains water as a dispersion medium or a solvent used for dispersing or dissolving each components. From the viewpoint of suppressing the inhibition of the actions of the other components, water that does not contain impurities as possible is preferable, and specifically, pure water, ultrapure water, or distilled water from which foreign substances are removed by being passed through a filter after removing impurity ions with an ion-exchange resin, is preferable.

[Other Components]

The polishing composition of the invention may further contain other components, as necessary, such as additives having a function to further enhance the polishing rate such as complexing agents, etching agents, and oxidizing agent, additives to impart hydrophilicity or dispersion effect to the surface of the sapphire substrate, preservatives, antifungal agents, rust preventives, chelate agents, dispersing agents to improve dispersibility of the abrasive grains, dispersing aids to ease redispersion of the aggregates of abrasive grains, and pH adjusters.

Here, when additives to impart hydrophilicity or dispersion effect to the surface of the sapphire substrate, dispersing agents, or dispersing aids are added, processing by the solid phase reaction of the colloidal silica particles to the sapphire substrate is suppressed, and thus there is a concern that a preferred polishing rate cannot be achieved. For this reason, when these additives are added, addition amounts thereof are preferably less than 1% by mass, more preferably less than 0.5% by mass, and still more preferably less than 0.1% by mass, with respect to the polishing composition.

Hereinafter, a pH adjuster as one of preferable other components will be described.

[pH Adjuster]

It is preferable that the polishing composition of the invention contain a pH adjuster. The pH adjuster adjusts a pH value of the polishing composition. According to this, it is possible to control the polishing rate of the sapphire substrate, dispersibility of the colloidal silica particles, or the like. The pH adjuster can be used alone or in combination of two or more kinds thereof.

As the pH adjuster, known acids, bases, or salts thereof can be used. Specific examples of acids which can be used as the pH adjuster include inorganic acids such as hydrochloric acid, sulfuric acid, nitric acid, hydrofluoric acid, boric acid, carbonic acid, hypophosphorous acid, phosphorous acid, and phosphoric acid; and organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycollic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, and phenoxyacetic acid. When inorganic acids are used as the pH adjuster, in particular, sulfuric acid, nitric acid, or phosphoric acid is particularly preferable from the viewpoint of improving a polishing rate. When organic acids are used as the pH adjuster, glycollic acid, succinic acid, maleic acid, citric acid, tartaric acid, malic acid, gluconic acid, and itaconic acid are preferable.

Examples of bases which can be used as the pH adjuster include amines such as aliphatic amine and aromatic amine, organic bases such as quaternary ammonium hydroxide, hydroxides of alkali metal such as potassium hydroxide, hydroxides of alkaline-earth metal, tetramethylammonium hydroxide, and ammonia. Among these, potassium hydroxide or ammonia is preferable in terms of ready availability.

Further, salts, such as an ammonium salt and an alkali metal salt, of the acids described above may be used as the pH adjuster, either instead of the acids described above or in combination with the acids described above. In particular, in a case where a weak acid is used in combination with a strong base, a strong acid is used in combination with a weak base, or a weak acid is used in combination with a weak base, a pH-buffering effect can be expected.

An addition amount of the pH adjuster is not particularly limited, but may be appropriately adjusted such that the polishing composition has a desired pH value.

A lower limit of a pH value of the polishing composition of the invention is preferably 5 or more, and more preferably 7 or more. As the pH value of the polishing composition increases, dispersibility of the colloidal silica particles as abrasive grains is improved.

Further, an upper limit of a pH value of the polishing composition of the invention is preferably 11 or less, and more preferably 10 or less. As the pH value of the polishing composition decrease, dispersibility of the colloidal silica particles, safety of the composition, economic efficiency of the composition, or the like is further improved. The upper limit of the pH value is more preferably 11 or less from the viewpoint of reducing (or preventing) occurrence of scratch.

[Method for Producing Polishing Composition]

The method for producing a polishing composition of the invention is not particularly limited, but for example, the polishing composition can be obtained by mixing colloidal silica particles, and as necessary, other components such as a pH adjuster, in water under stirring.

An order of mixing each component, a temperature at the time of mixing, and a mixing time are not particularly limited.

[Polishing Method and Method for Manufacturing Sapphire Substrate]

As described above, the polishing composition of the invention is preferably used in an application to polish a sapphire substrate having a non-polar plane (for example, an A-plane or an M-plane) or a semi-polar plane (for example, an R-plane). Therefore, the invention is to provide a polishing method of polishing a sapphire substrate having a non-polar plane or a semi-polar plane by using the polishing composition of the invention. Further, the invention is to provide a method for manufacturing a sapphire substrate, the method including a step of polishing a sapphire substrate having a non-polar plane or a semi-polar plane by the polishing method.

When the sapphire substrate is polished by using the polishing composition of the invention, general apparatuses and conditions used in polishing of the sapphire substrate can be used. As general polishing apparatuses, a single-side polishing apparatus or a double-side polishing apparatus is exemplified. In the single-side polishing apparatus, one surface of the substrate is polished in such a manner that the substrate is held by using a holding jig called a carrier, which is attached to an attachment plate typified by a ceramic plate or the like, a surface plate attached with an abrasive cloth is pressed against the one surface of the substrate and then the surface plate is rotated while the polishing composition is supplied. Since a polishing load can be increased and the sapphire substrate can be fixed to the attachment plate in the processing by using the single-side polishing apparatus, adhesion between the substrate and the abrasive grains can be increased. For this reason, the solid phase reaction between the subject and the abrasive grains is efficiently performed, and polishing efficiency can be improved even when the number average particle diameter is small. In the double-side polishing apparatus, both surfaces of the substrate are polished in such a manner that the substrate is held by using a holding jig called a carrier, surface plates each attached with an abrasive cloth are pressed against the opposing surfaces of the substrate and then these surface plates are rotated in a relative direction while the polishing composition is supplied from the upper side. In the case of processing by using the double-side polishing apparatus, there are limitations in the polishing load in terms of the apparatus configuration and thus a large load cannot be applied. The sapphire substrate is not completely fixed to the carrier and thus the polishing load is likely to be scattered. For this reason, in order to efficiently perform the solid phase reaction between the substrate and the abrasive grains and sufficiently exert the polishing efficiency, it is preferable that the number average particle diameter be relatively large. On the other hand, in the double-side polishing apparatus, it can be estimated that the improvement of polishing efficiency can be expected because of the friction force due to the fact that the abrasive grains are asperities. Even in any cases, since polishing is performed by physical action due to the friction among the polishing pad, the polishing composition and the substrate, and chemical action which is applied to the substrate with the polishing composition, it is important to efficiently perform the solid phase reaction between the substrate and the abrasive grains.

As polishing conditions in the polishing method of the invention, the polishing load is exemplified. In general, the larger the load is, the higher the friction force by the abrasive grain becomes. Consequently, mechanical processability is improved and thus the polishing rate increases. A lower limit of the load in the polishing method of the invention is not particularly limited, but is preferably 50 g/cm$^2$ or more, more preferably 100 g/cm$^2$ or more, and still more preferably 300 g/cm$^2$ or more per unit area of the substrate. On the other hand, an upper limit of the load is not particularly limited, but is preferably 1,000 g/cm$^2$ or less, more preferably 800 g/cm$^2$ or less, and still more preferably 600 g/cm$^2$ or less. When the polishing load is small, a sufficient polishing rate may not be exerted in some cases. Further, when the polishing load is large, substrate damage and generation of surface defects such as scratch due to the load may occur in some cases.

Further, as polishing conditions in the polishing method of the invention, linear velocity in polishing is exemplified. The linear velocity is generally affected by the number of revolutions of the polishing pad, the number of revolutions of the carrier, sizes of the substrate, the number of the substrates, and the like. As the higher linear velocity leads to an increased friction force applied to the substrate, the mechanical polishing action on edges is enhanced. In addition, friction heat is generated by friction and the friction heat may enhance the chemical action of the polishing composition. A lower limit of the linear velocity in the polishing method according to the invention is not particularly limited, but is preferably 10 m/min or more, and more preferably 25 m/min. On the other hand, an upper limit of the linear velocity in the polishing method according to the invention is not particularly limited, but is preferably 300 m/min or less, and more preferably 200 m/min or less. When the linear velocity is slow, a sufficient polishing rate may not be achieved in some cases. Further, when the linear velocity is high, in some cases, the polishing pad may be damaged by the friction of the substrate, or conversely, the friction cannot be sufficiently transmitted to the substrate and thus polishing cannot be sufficiently performed because of a so-called substrate sliding state.

The polishing pad used in the polishing method of the invention is not particularly limited, but any polishing pads made of different materials, for example, a polyurethane type, a non-woven fabric type, and a suede type, any polishing pads with different physical properties such as hardness and thickness, and polishing pads containing abrasive grains, polishing pads without abrasive grains, or the like, may be employed.

When the sapphire substrate is polished by using the polishing composition described above, the polishing compound, which has been used in polishing once, is recovered and then can be reused in polishing. As an example of a method of reusing the polishing composition, a method of recovering the polishing composition discharged from a polishing apparatus into a tank and using the recovered polishing composition by recycling it in the polishing apparatus is exemplified. Cyclic use of the polishing composition is useful in that environmental burden can be reduced by decreasing an amount of the polishing composition discharged as waste liquid and a manufacturing cost in polishing of the sapphire substrate can be suppressed by decreasing an amount of the polishing composition to be used.

When the polishing composition is recycled for using, colloidal silica particles and some or whole of the additive which have been consumed or lost due to polishing may be added as a composition adjuster during cyclic use. In this case, a material obtained by mixing colloidal silica particles and some or whole of an additive at an arbitrary mixing ratio may be used as a composition adjuster. When the composition adjuster is additionally added, the polishing composition is adjusted to be a composition suitable for reusing and thus polishing is favorably maintained. The concentrations of colloidal silica particles and an additive to be contained in a composition adjuster are arbitrary and not particularly limited, but it is preferable to properly adjust the concentration thereof according to a size of a circulation tank or polishing conditions.

As polishing conditions in the polishing method of the invention, a supply amount of the polishing composition is exemplified. The supply amount may vary depending on a type of a substrate to be polished, a polishing apparatus, or a polishing condition, but it may be the amount sufficient to be evenly supplied to the whole surface between a substrate and a polishing pad without unevenness. When the supply amount of the polishing composition is small, in some cases, the polishing composition may not be supplied to the entire substrate or the polishing composition is dried and solidified, which may cause a defect on the substrate surface. On the other hand, when the supply amount is large, it is not economic, friction is interrupted by an excessive amount of the polishing composition, particularly, by a medium such as water, and thus polishing may be inhibited.

The polishing composition of the invention may be one-component type or multi-component type including two-component type in which some or whole of polishing compositions are mixed at an arbitrary mixing ratio. In addition, when a polishing apparatus having a plurality of supply passages for the polishing composition is used, two or more polishing compositions which have been adjusted in advance may be used such that the polishing compositions are mixed in the polishing apparatus.

The polishing composition of the invention may be prepared by diluting a stock solution of the polishing composition with water. When the polishing composition is of two-composition type, the order of mixing and diluting both of the compositions may be changed arbitrarily. For example, one composition may be diluted with water, followed by mixing the dilution with the other composition, both of the compositions may be mixed together and diluted with water simultaneously, or alternatively, both of the compositions may be mixed together, followed by diluting the mixed polishing composition with water.

EXAMPLE

The invention will be described in more detail by means of the following Examples and Comparative Examples. However, the technical scope of the invention is not intended to be limited only to the following Examples.

Examples 1 to 10 and Comparative Examples 1 and 2

Polishing compositions of Examples 1 to 10 and Comparative Examples 1 and 2 were prepared by mixing colloidal silica having properties as presented in the following Table 4, water, and a pH adjuster. As the pH adjuster, nitric acid or potassium hydroxide was used. Five sheets of sapphire substrates (sapphire substrates having an A-plane) were subjected to double-side polishing simultaneously under conditions presented in Table 1 by using each of the polishing compositions of Examples 1 to 10 and Comparative Examples 1 and 2. In addition, three sheets of sapphire substrates having a C-plane were subjected to single-side polishing simultaneously under conditions presented in Table 2 by using each of the polishing compositions of Examples 1 to 7, Example 10, and Comparative Examples 1 and 2. Further, 48 sheets of sapphire substrates having an A-plane were subjected to single-side polishing simultaneously under conditions presented in Table 3 by using each of the polishing compositions of Examples 1 to 3, Examples 6 to 10, and Comparative Example 1. Furthermore, 48 sheets of sapphire substrates having a C-plane were subjected to single-side polishing simultaneously under conditions presented in Table 3 by using each of the polishing compositions of Examples 1 to 10 and Comparative Examples 1 and 2. All of the sapphire substrates used were circular (a diameter of 2 inches).

The specific surface area of colloidal silica was measured using "Flow SorbII 2300" manufactured by Micromeritics Instrument Corporation according to a BET method. Further, the number average particle diameter, $D_3$, $D_{97}$, and the aspect ratio of the colloidal silica particles were calculated from images of the colloidal silica particles obtained by a scanning electron microscope (S-4700 manufactured by Hitachi High-Technologies Corporation) by using image analysis software or the like. Polishing was performed for 60 minutes by using the polishing composition of each of Examples and Comparative Examples, masses of the sapphire substrates before and after polishing were measured, and then polishing rates were obtained by calculation from a difference between the masses before and after polishing. The obtained polishing rates are presented in the following Table 4.

TABLE 1

<Sapphire Substrate Polishing Condition 1>

Polishing apparatus: Double-side polishing apparatus "6B" (surface plate diameter: 380 mm) manufactured by HAMAI CO., LTD.
Polishing pad: Non-woven fabric polishing pad "SUBA (trade name) 800" manufactured by Nitta Haas Incorporated
Polishing load: 300 g/cm$^2$ (29.4 kPa)
Surface plate rotational rate: 40 rpm
Linear velocity: 26 m/min TABLE 1-continued <Sapphire Substrate Polishing Condition 1>

Polishing composition supply rate: 160 mL/min
Polishing composition volume: 1,000 mL

TABLE 2

<Sapphire Substrate Polishing Condition 2>

Polishing apparatus: Single-side polishing apparatus "EJ-380IN" (surface plate diameter: 380 mm) manufactured by ENGIS JAPAN Corporation
Polishing pad: Non-woven fabric polishing pad "SUBA (trade name) 800" manufactured by Nitta Haas Incorporated
Polishing load: 300 g/cm$^2$ (29.4 kPa)
Surface plate rotational rate: 40 rpm
Linear velocity: 26 m/min
Polishing composition supply rate: 100 mL/min
Polishing composition volume: 500 mL

TABLE 3

<Sapphire Substrate Polishing Condition 3>

Polishing apparatus: Single-side polishing apparatus "SPM-12" (surface plate diameter: 760 mm) manufactured by Fujikoshi Machinery Corp.
Polishing pad: Non-woven fabric polishing pad "SUBA (trade name) 800" manufactured by Nitta Haas Incorporated
Polishing load: 300 g/cm$^2$ (29.4 kPa)
Surface plate rotational rate: 40 rpm
Linear velocity: 58 m/min
Polishing composition supply rate: 1000 mL/min
Polishing composition volume: 12000 mL

TABLE 4

| | Example 1 | Example 2 | Example 3 | Example 4 | Example 5 | Example 6 | Example 7 | Example 8 | Example 9 | Example 10 | Comparative Example 1 | Comparative Example 2 |
|---|---|---|---|---|---|---|---|---|---|---|---|---|
| Specific surface area (m$^2$/g) | 46 | 46 | 51 | 57 | 53 | 57 | 60 | 83 | 57 | 83 | 34 | 34 |
| Number average particle diameter (nm) | 64 | 64 | 68 | 63 | 38 | 45 | 36 | 33 | 45 | 28 | 105 | 105 |
| Specific surface area/Number average particle diameter | 0.72 | 0.72 | 0.74 | 0.91 | 1.41 | 1.26 | 1.68 | 2.48 | 1.26 | 2.91 | 0.32 | 0.32 |
| $D_3$ (nm) | 33 | 33 | 39 | 32 | 16 | 27 | 25 | 25 | 27 | 11 | 51 | 51 |
| $D_{97}$ (nm) | 121 | 121 | 114 | 113 | 85 | 101 | 107 | 109 | 101 | 68 | 125 | 125 |
| $D_{97}/D_3$ | 3.7 | 3.7 | 2.9 | 3.6 | 5.4 | 3.7 | 4.3 | 4.4 | 3.7 | 6.0 | 2.4 | 2.4 |
| Aspect ratio | 1.13 | 1.13 | 1.13 | 1.09 | 1.08 | 1.13 | 109 | 1.09 | 1.13 | 1.00 | 1.03 | 1.03 |
| pH value of polishing composition | 9 | 10 | 9 | 9 | 9 | 9 | 9 | 9.5 | 10 | 9 | 10 | 9 |
| Polishing rate in double-side polishing apparatus (μm/hr) (Sapphire substrate Polishing condition 1, A-plane) | 0.44 | 0.44 | 0.48 | 0.47 | 0.44 | 0.41 | 0.33 | 0.29 | 0.22 | 0.29 | 0.11 | 0.13 |
| Polishing rate in single-side polishing apparatus (μm/hr) (Sapphire substrate Polishing condition 3, A-plane) | 0.83 | 0.94 | 0.92 | — | — | 1.11 | 0.54 | 0.77 | 1.14 | 1.05 | 0.24 | — |
| Polishing rate in single-side polishing apparatus (μm/hr) (Sapphire substrate Polishing condition 2, C-plane) | 0.63 | 0.60 | 0.33 | 0.98 | 1.07 | 0.66 | 1.39 | — | — | 0.48 | 0.95 | 0.99 |
| Polishing rate in single-side polishing apparatus (μm/hr) (Sapphire substrate Polishing condition 3, C-plane) | 1.41 | 1.34 | 0.73 | 2.20 | 2.39 | 1.98 | 3.22 | 3.52 | 1.98 | 2.16 | 2.03 | 2.21 |

As clearly shown by Table 4 described above, it was found that each polishing composition of the invention in Examples 1 to 10 had a high polishing rate when the sapphire substrate having an A-plane was polished.

INDUSTRIAL APPLICABILITY

According to the invention, since a sapphire substrate having a non-polar plane (for example, an A-plane or an M-plane) or a semi-polar plane (for example, an R-plane) can be polished at a high polishing rate, the invention is expected to contribute to improvement in productivity of a sapphire substrate or a decrease in manufacturing cost thereof.

Incidentally, the present application is based on Japanese Patent Application No. 2013-31228 filed on Feb. 20, 2013 and Japanese Patent Application No. 2013-177027 filed on Aug. 28, 2013, and the disclosure of which is herein incorporated by reference in entirety.

The invention claimed is:

1. A polishing composition used in an application to polish a sapphire substrate having a non-polar plane or a semi-polar plane, the polishing composition comprising:
   colloidal silica particles and water,
   wherein a value obtained by dividing a specific surface area (unit: m$^2$/g) of the colloidal silica particles by a number average particle diameter (unit: nm) of the colloidal silica particles, that is, (specific surface area/number average particle diameter) is 0.5 or more and 3.0 or less, and the specific surface area of the colloidal silica particles is 60 m$^2$/g or less, and an aspect ratio of the colloidal silica particles is 1.25 or less.

2. The polishing composition according to claim 1, wherein the value obtained by dividing a specific surface area (unit: m$^2$/g) of the colloidal silica particles by a number average particle diameter (unit: nm) of the colloidal silica particles, that is, (specific surface area/number average particle diameter) is 0.5 or more and 2.0 or less.

3. The polishing composition according to claim 1, wherein, when a particle size at a 3% accumulation point from smaller particle size is denoted as $D_3$ and a particle size at a 97% accumulation point from smaller particle size is denoted as $D_{97}$ in a cumulative number distribution of the colloidal silica particles, a value obtained by dividing $D_{97}$ by $D_3$, that is, ($D_{97}/D_3$) is 2.0 or more.

4. The polishing composition according to claim 1, wherein an aspect ratio of the colloidal silica particles is 1.10 or more.

5. The polishing composition according to claim 1, wherein a pH value is 5 or more and 11 or less.

6. A polishing method of polishing a sapphire substrate having a non-polar plane by using a polishing composition comprising:
   colloidal silica particles and water,
   wherein a value obtained by dividing a specific surface area (unit: m$^2$/g) of the colloidal silica particles by a number average particle diameter (unit: nm) of the colloidal silica particles, that is, (specific surface area/number average particle diameter) is 0.5 or more and 3.0 or less, and wherein an aspect ratio of colloidal silica particles is 1.25 or less.

7. A method for manufacturing a sapphire substrate, the method comprising a step of performing polishing by the polishing method according to claim 6.

8. A polishing method according to claim 6, wherein the non-polar plane is an A-plane.

* * * * *